United States Patent
Saur

(10) Patent No.: US 6,434,202 B1
(45) Date of Patent: Aug. 13, 2002

(54) METHOD AND APPARATUS FOR FORMING PULSE SHAPED SIGNALS

(75) Inventor: Eric Saur, Nuremberg (DE)

(73) Assignee: Lucent Technologies Inc., Murray Hill, NJ (US)

( * ) Notice: Subject to any disclaimer, the term of this patent is extended or adjusted under 35 U.S.C. 154(b) by 0 days.

(21) Appl. No.: 09/045,502

(22) Filed: Mar. 20, 1998

(30) Foreign Application Priority Data

Mar. 22, 1997 (DE) .......................................... 197 12 161

(51) Int. Cl.$^7$ ................................................ H04K 1/02
(52) U.S. Cl. ........................ 375/297; 375/286; 375/340
(58) Field of Search ................................ 375/239, 238, 375/268, 286, 377, 340, 353, 352, 345, 297; 327/306, 308, 178, 179, 50, 51, 52, 31, 170, 263; 330/284; 333/81 R

(56) References Cited

U.S. PATENT DOCUMENTS

| | | | | |
|---|---|---|---|---|
| 4,750,156 A | * | 6/1988 | Abrams et al. ................. 367/42 |
| 4,937,535 A | * | 6/1990 | Underwood et al. ......... 330/284 |
| 5,161,170 A | * | 11/1992 | Gilbert et al. ................. 373/98 |
| 5,173,775 A | * | 12/1992 | Walker ......................... 348/470 |
| 5,231,343 A | * | 7/1993 | Nakamura ................... 318/696 |
| 5,389,216 A | * | 2/1995 | Balkanli |
| 5,418,770 A | * | 5/1995 | Ide et al. ..................... 369/116 |
| 5,438,683 A | * | 8/1995 | Durtler et al. ................. 455/74 |
| 5,568,105 A | * | 10/1996 | O'Leary et al. ........... 333/81 R |
| 5,633,625 A | * | 5/1997 | Gaub et al. .................. 340/438 |
| 5,640,691 A | * | 6/1997 | Davis et al. ................. 455/126 |
| 5,734,974 A | * | 3/1998 | Callaway, Jr. et al. ... 455/234.1 |
| 5,742,201 A | * | 4/1998 | Eisenberg et al. ............. 330/2 |
| 5,838,210 A | * | 11/1998 | Midya et al. ................ 332/109 |
| 5,841,319 A | * | 11/1998 | Sato ............................ 330/129 |
| 5,847,675 A | * | 12/1998 | Poinsard ....................... 342/81 |
| 5,933,013 A | * | 8/1999 | Kimura ........................ 324/601 |
| 6,044,253 A | * | 3/2000 | Tsumura .................. 455/234.1 |
| 6,188,444 B1 | * | 2/2001 | Webb .......................... 348/625 |
| 6,348,987 B1 | * | 2/2002 | Tomofuji .................... 359/177 |

* cited by examiner

*Primary Examiner*—Chi Pham
*Assistant Examiner*—Emmanuel Bayard
(74) *Attorney, Agent, or Firm*—Christopher N. Malvone

(57) ABSTRACT

Pulses of high-frequency signals (HFS) with different power levels ($P_{1...n}$) are generated using a first control element (2) for adjusting a power level ($P_{1...n}$) of a pulse plateau ($BP_{1...N}$), and a second control element (3) for adjusting a number of level values ($PW_{1...n}$, $PW'_{1...n}$) for forming the respective pulse edge ($PF_{1...N}$) Using an attenuator (2) as a first control element, the power ($P_N$) of a burst ($BP_N$) of the high-frequency signal (HFS) can be adjusted with high precision in small defined power steps, e.g. in a 2-dB tuning lock (ramping), within a time division multiple access system(TDMA) from one time division ($Z_m$) to the next time division ($Z_{M+1}$). Furthermore, the rate of change of the burst or of each burst ($BP_N$) can be controlled by means of the second control element in the form of a controllable amplifier, so that an admissible interference spectrum is kept and interferences through spurious radiation are avoided.

8 Claims, 3 Drawing Sheets

METHOD AND APPARATUS FOR FORMING PULSE SHAPED SIGNALS

BACKGROUND OF THE INVENTION

1. Field of the Invention

The present invention relates to a device for generation of signals with diversified power levels, especially for pulse formation.

2. Description of the Related Art

A transmitter of a TDMA (Time Division Multiple Access) system is usually conceived in such a manner that it is possible to transmit in individual time slots high frequency signals with varying output or power levels. In this manner the transmission power is set such that in every time slot, each of which is assigned to a respective radio channel, each respective transmission power level is set in such a way that, in spite of diverse distances between the base station and the mobile stations, transmission without interference becomes possible. Since each radio channel is operated with a minimum transmission energy, then because of reduced interferences in the same channel and in adjacent channels in the overall system, a minimized level of interference results. Especially with GSM transmitters there is the requirement that a transmission signal or transmission burst in the burst plateau must be adjustable in defined power steps at a very tight tolerance. Beyond that the edges of the burst must also be contained within a defined amplitude frame, with a simultaneous requirement that the interference spectrum caused because of the steepness of the edge of the burst must be contained within an admissible range. An inadmissible interference spectrum would lead to interferences with neighboring transmission and reception channels.

With a high frequency transmitter with regulated output power, known from DE 39 40 295 A1, a part of the output power of a high frequency power amplifier is coupled out by means of a hybrid coupler located at its output. The coupled out high frequency (HF) power is first rectified and inverted and sent to a servo amplifier as the actual value. By means of a set point adjuster, in accordance with a desired output power, an electrical voltage is applied to the servo amplifier. Using the difference in voltage between the desired value and the actual value, the servo amplifier generates an adjustment voltage which is conducted to an HF amplifier via a control input. The output of the HF amplifier or preamplifier is connected to the input of an HF final stage (power amplifier), so that in this way a closed control circuit originates. However, the expense for realizing such a control circuit is especially high because it is necessary to measure and compensate a great number of parameters to guarantee a sufficiently high dynamic range of the control circuit for all operating conditions. It is especially necessary to include several parameters for the compensation of the nonlinearity and temperature drift of the transmission amplifier.

The customary high frequency power amplifiers have, as a rule, a non-linear transfer function, so that an input signal is not amplified in proportion to its power, at least over a wide range of levels. Likewise, amplifiers with an additional control input for adjusting the amplification have a non-linear dependence of amplifier output power on the control or setting voltage. Thus a precise setting of defined power steps or power levels with a low tolerance, especially for bursts of high dynamic [range] is only possible at considerable expense.

SUMMARY OF THE INVENTION

The present invention provides a device for pulse formation of high frequency signals, especially for generating bursts, which makes possible precise setting of diverse levels of power at high burst dynamics at especially low expense. Two separate servo components are provided to set a power step of a pulse- or burst-plateau on one hand, as well as to set a number of level values for the formation of the respective pulse edges on the other hand. For setting the level, preferably a stepwise adjustable attenuator is applied, while for the formation of the pulse edges a controllable amplifier is expediently used.

The invention is based on the consideration that in the generation of high frequency bursts of high dynamics a control loop can be dispensed with if the different power levels of the burst- or pulse-plateau on one hand, and the power during the burst- or pulse-edges on the other hand, are set independently of one another. With TDMA-systems, such as e.g. GSM, there exists a high demand for accuracy with regard to the power level during the burst plateau. Against that, the setting of the power within the burst edges is of subordinate importance as long as the monotonicity of the transfer characteristics and the maintenance of the admissible spectrum is assured. Altogether, by the suitable combination of two servo components it is possible to realize an adjustment range of more than 90 dB. Out of this, depending on the linearity of the controllable amplifier, a plateau dynamic range of over 50 dB can be set with high absolute accuracy.

The first servo component which carries out the precise setting of each power level required within the burst plateau, is in a preferred form of execution a digital step attenuator with a number of binary steps. Through this a large number of attenuation steps are realized in small steps of attenuation. For the second servo component, which takes over the relatively inexact control of power variation change during the burst edges, a controllable power amplifier is used. The input power level of this power amplifier is suitably chosen in a manner such that its output power at minimum attenuation of the stepwise attenuator connected, as the first servo component, at the input side [of the power amplifier] is located only slightly below its 1 dB compression point. Since customary amplifiers, which operate within an operating point range, have below the 1 dB compression point a linear range of amplification of more than 45 dB, corresponding input signals, which are located within this linear dynamic range are transferred to the output with a small relative error. With the MMIC (Monolithic Microwave Integrated Circuit) amplifiers available in today's market this error in linearity amounts to less than ±1 dB over a dynamic range of almost 50 dB below the 1 dB compression point. Consequently, the signal levels supplied at the input of the amplifier within this range by the first servo component are preserved in their relative separations at the output of the amplifier. Only the levels are raised corresponding to the amplification of the amplifier.

The control input of the controllable amplifier serves for lowering the burst level below the lowermost plateau level. Through a correspondingly controlled voltage the output power of the amplifier is raised or lowered according to the required steepness of the edge. Normally, no special accuracy of the level is required there. This inexact setting range of the controllable amplifier can, if the customary components are used, amount up to about 50 dB.

This joint operation of the two servo components on the high frequency signal or on its bursts is controlled by a CPU, for example via D/A converters (DAC, Digital-Analog Converter). Thus, for example, a first D/A converter, coordinated with the first servo component, can control the 21 output steps specified in a GSM transmitter in 2 dB steps, while a second D/A converter, coordinated with the second servo component, forms, through the output of some few values, the pulse edges of the respective bursts. To this end the second D/A converter controls the second servo component, realized as an amplifier, upwards or downwards between saturation and minimum power, with a low pass filter preferably being connected after the single, or after every, D/A converter for pulse smoothing purposes. Upon application of one D/A converter each for each of the control elements, the corresponding low pass filters have different time constants.

To further amplify the output power of the controllable amplifier serving as the second servo component, a power amplifier (final stage) can be connected after it. This final stage, which for example can be a fixed [gain] amplifier, is likewise operated, analogously to the second servo component, in the range below saturation power, so that the power set in the pulse forming device connected before it is further amplified in proportion. Thereby the linearity of the level setting remains preserved, so that each respective power level, and thereby the burst plateau, can be set. If a final stage in form of a likewise adjustable power amplifier is employed, the second servo element works as preamplifier.

The advantages gained by the invention consist especially in that TDMA bursts can be generated at very favorable cost in a simple manner and with high dynamics. Using customary structural components it is thereby possible to realize a burst dynamic of over 90 dB at a low cost.

The device can always be applied in such cases where pulse formation of high frequency signals of large dynamic [range] with application of simple and inexpensive means is desired or required. Thus it is especially suitable for application in TDMA transmitters within the GSM system, because, on one hand, by applying an attenuator as first servo element in small, defined power steps, e.g. in a 2 dB raster (ramping), the power of a burst of a high frequency signal can be set within a time division multiple access system (TDMA) from one time slot to the next time slot with high accuracy. On the other hand it is possible by means of the second servo element, in the form of a controllable amplifier, to master the edge steepness even of a burst of high dynamic, so that an admissible interference spectrum is maintained, and interferences through neighboring radiations are prevented.

DETAILED DESCRIPTION

Figure 1:
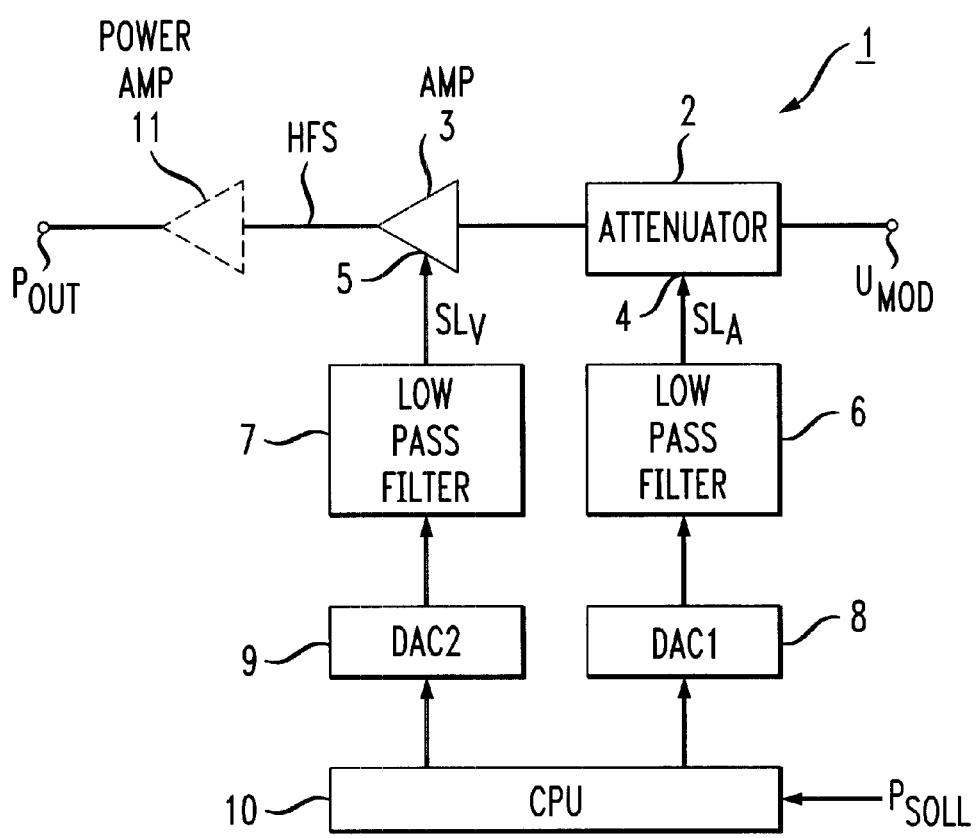
FIG. 1 schematically illustrates a device for creation of high frequency signals with servo components for level setting.
Figure 5:
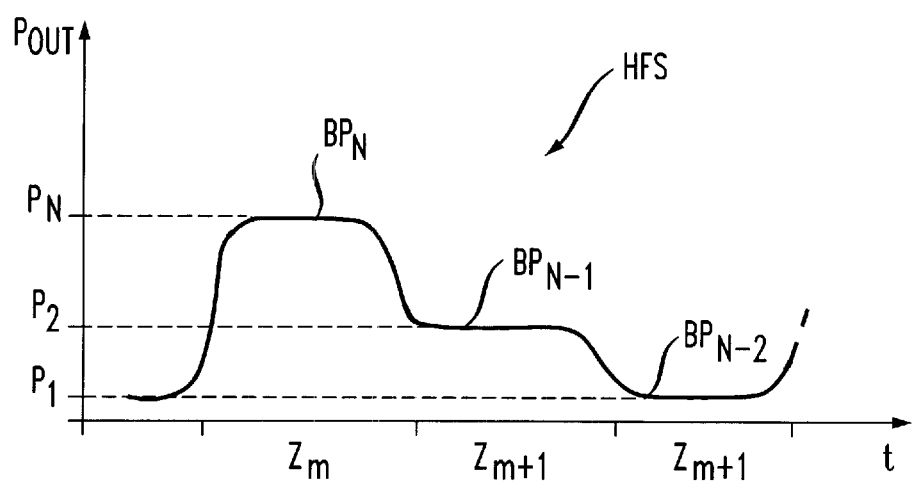
FIG. 5 is a power level/time plot of a typical high frequency signal within a TDMA system.

FIG. 1 shows schematically a setting device 1 for creating bursts of a high frequency or HF signal with a first servo component 2 in the form of an attenuator, and with a second servo component 3, connected after the first servo component 2, in the form of a controllable amplifier 3. The first servo component 2 is e.g. an electronic attenuation element based on PIN diodes. The attenuator 2 and the controllable amplifier 3 have each a control input 4 and 5 respectively, which are respectively connected via low pass filters 6, 7 and digital/analog converters 8. (DAC1) and 9 (DAC2) connected before those, to a central control device 10 (CPU). Based on a desired power value $P_{soll}$ the respective output powers of both servo components 2 and 3 are set. To obtain a further amplified output power $P_{out}$, a power amplifier 11 can be connected after the amplifier 3. To the servo component 1 there is conducted at the input end a modulation signal $U_{mod}$. By means of suitable set control voltages $SL_A$ and $SL_V$ at the respective control inputs 4 or 5, there occurs the generation of a sequence of transmission bursts with plateau power levels $BP_N$ within the time slots $Z_m$ (FIG. 5).

Figure 2:
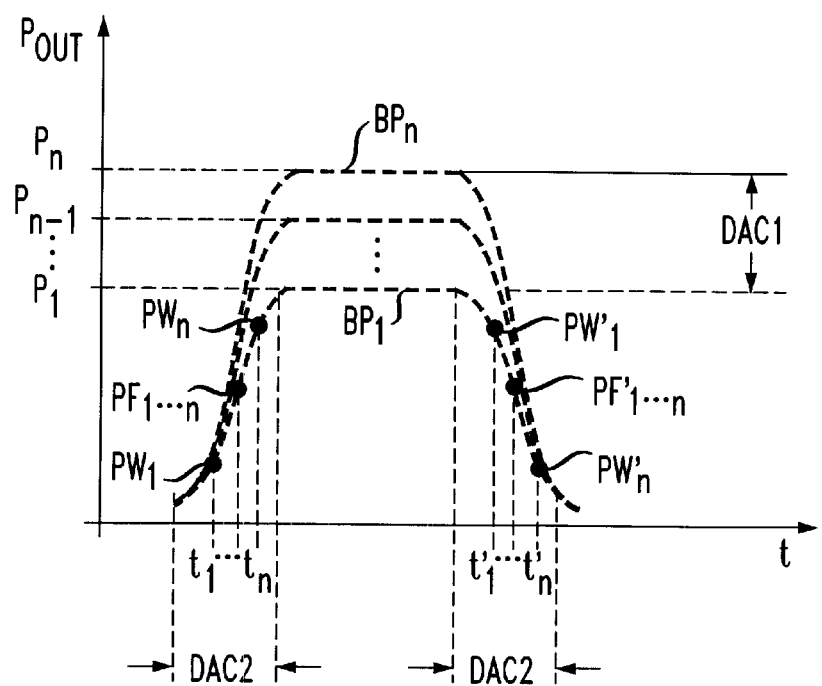
FIG. 2 is a power level/time plot of a high frequency signal with variable burst plateaus.
Figure 3:
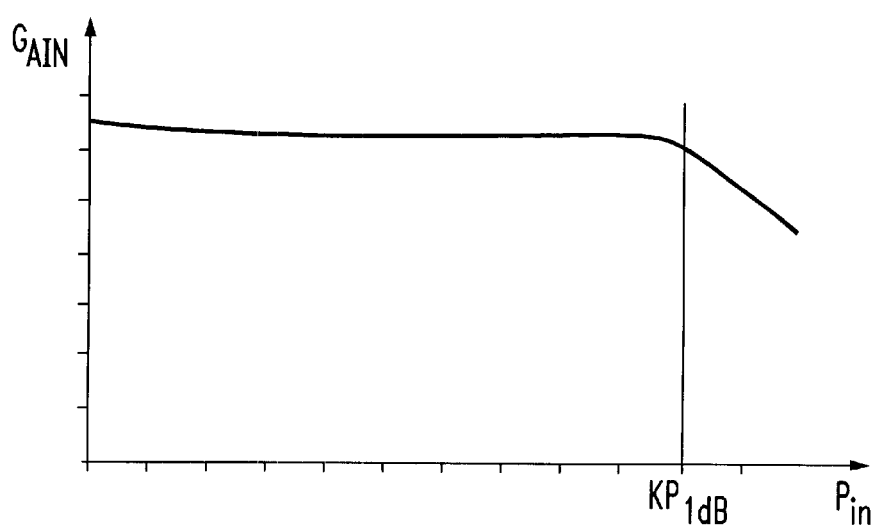
FIG. 3 is a gain/power plot of an amplification course of a power amplifier.

The attenuator 2 serves to set diverse power levels $P_{1...N}$ of each transmission burst (FIG. 2). Since the usual HF amplifiers have in general within the range below their saturation power a transfer function such as has been represented quantitatively in FIG. 3 quantitatively in an amplification (gain)/power($P_{in}$) plot, the power $P_{1...N}$ set in attenuator 2 is further amplified proportionally in amplifier 3, so that the linearity of the level setting remains maintained. Here $KP_{1\ dB}$ designates the 1 dB compression point. Thus it is possible to set the plateau power of each HF burst of the high frequency signal HFS within this approximately linear realm with a setting value of the control voltage $SL_A$.

FIG. 2 shows quantitatively the joint effect of both servo elements 2 and 3 on an HF burst. Shown are various power levels $P_{1...N}$ of pulse plateaus $BP_{1...N}$ of individual bursts of the high frequency signal HFS in an output power/time plot. By the amplification setting of amplifier 3 by means of the control voltage $SL_V$ it is possible, in addition, to increase or decrease the power within each burst- or pulse-edge $PF_{1...N}$ and $PF'_{1...N}$ by setting a few individual power values $PW_{1...n}$ or $PW'_{1...n}$. Smoothing the control voltage $SL_V$ between these support values can be done e.g. by means of the low pass filter 7.

It is expedient to apply as amplifier 3 a hybrid amplifier module or an integrated amplifier.(MMIC) with a adjustment range of preferably 50 dB. The combined effect of the amplifier 3 and the attenuator 2 is controlled by the two D/A converters 8 and 9. At that the converter 8 controls, e.g. in a GSM (Global System for Mobile Communication) transmitter, the 21 power steps $P_{1...N}$ defined in the GSM specification in 2 dB steps, so that between the minimum power level $P_1$ of the corresponding burst level $BP_1$ and the maximum power level $P_{N=21}$ of the corresponding burst plateau $BP_N$ there results altogether a difference of 42 dB. The converter 9 forms, by issuing a few pulse values, which are smoothed in the low pass filter 7, the pulse edges $PF_{1...N}$ and $PF'_{1...N}$ of the respective burst. To this and there are set in the rise times $t_{1...n}$ and $t'_{1...n}$ the corresponding power values $PW_{1...n}$ or $PW'_{1...n}$. While the filter time constant of the preferably 5 bit converter 8 (DAC1) is relatively long at 10 μs, the filter time constant of the preferably 3 bit converter 9 (DAC2) is relatively short at 2 μs.

Figure 4:
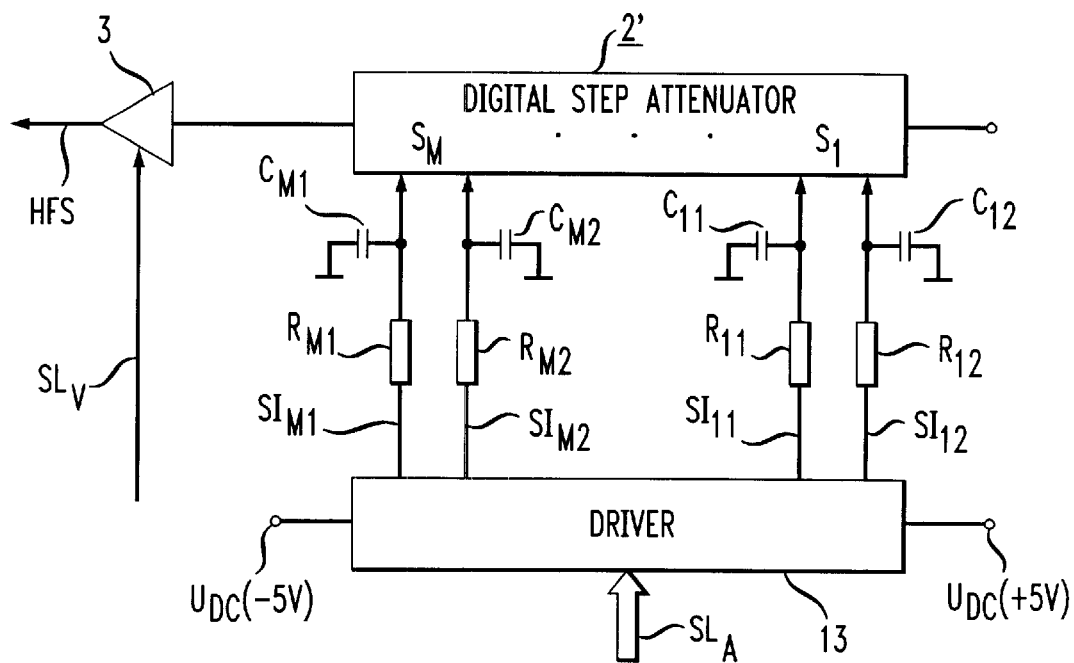
FIG. 4 illustrates a power step control circuit with a digital step attenuator.

FIG. 4 shows a preferred variant of execution of the first servo component 2 in the form of a digital step attenuator 2'. With the application of such a step attenuator 2' instead of a continuous attenuator 2 it is possible to omit the converter 8 (DAC1). The step attenuator 2' has a number of binary setting steps $S_{1...M'}$, so that, with the application of a corresponding driver 13 with N bits, altogether $2^M$ steps of reduction of e.g. 1 dB each can be set. Thus, e.g., altogether sixty four (64) reduction steps or stages are realized by use of a 6 bit driver 13. The digital driver 13 has two voltage connections for positive and negative DC voltage, $U_{DC}(-5V)$ and $U_{DC}(+5V)$.

Coordinated to each setting step $S_M$ of the stepwise attenuator 2' are two differential control voltage connections, each of which is connected via an RC element having a respective resistor $R_{M1}$ or $R_{M2}$ and a capacitor $C_{M1}$ or $C_{M2}$ to the driver 13. The RC elements cause a smoothing of the control pulses $SI_{M1}$ and $SI_{M2'}$, so that the control pulses $SI_{M1-2}$ exceed quasi-smoothly or creepingly the respective threshold values of the stepwise attenuator 2'. This brings about limitation of the interference spectrum which can be caused by the edge steepness of the setting voltage. By the rounded shape of the setting voltage edges it is made certain that the pulse edges $PF_{1...N}$ of the bursts of the high frequency signal HFS are contained within a required amplitude frame.

The device for burst generation of high frequency HFS signals is particularly suitable for application to a transmitter of a mobile radio system according to the GSM standard for time division multiple access operation (TDMA, Time Division Multiple Access), by which signals to be transmitted or to be received are time compressed as data packets to be transmitted or received at different respective points of time. A typical high frequency signal HFS with a number of bursts $BP_N$ with different power levels $P_N$ within various time slots $Z_m$ is shown as an example in FIG. 5.

List of References

| | |
|---|---|
| 1 | Control Device |
| 2 | first servo element/attenuator |
| 3 | second servo element/amplifier |
| 4–5 | control input |
| 6–7 | low pass filter |
| 8–9 | D/A converter/DAC1,2 |
| 10 | Central Control Unit/CPU |
| 11 | power amplifier |
| 13 | (bit) driver |
| $BP_{1-N}$ | burst-/pulse-plateau |
| CM1,2 | capacitor |
| HFS | high frequency signal |
| $P_{1...N}$ | power level |
| $P_{in}$ | input power level |
| $P_{out}$ | output power level |
| $P_{soll}$ | desired power value |
| $PF_{1...N}$ | pulse edge |
| $PW_{1...n}$ | pulse value |
| $R_{M1,2}$ | resistor |
| $S_{1...M}$ | steps of attenuation |

-continued

List of References

| | |
|---|---|
| $SI_{M1,2}$ | control pulse |
| $SL_{AV},LV$ | control signal |
| $U_{DC}$ | ± 5 V DC voltage |
| $U_{mod}$ | Modulation signal |
| $Z_m$ | time slot |

The invention claimed is:

1. A method for pulse forming, comprising the steps of:

modifying an amplitude of an input signal to produce an amplitude adjusted signal, an amplitude of the amplitude adjusted signal corresponding to a plateau level of the pulse; and controlling amplification of the amplitude adjusted signal using a plurality of stepped time varying amplification values to control a leading edge steepness and a trailing edge steepness of the pulse.

2. The method of claim 1, wherein the step of modifying comprises adjustably attenuating the amplitude of the input signal.

3. The method of claim 1, wherein the plurality of stepped time varying amplification values are increasing with time to form the leading edge of the pulse and decreasing with time to form the trailing edge of the pulse.

4. An apparatus for forming a pulse, comprising:

an adjustable attenuator that modifies an amplitude of an input signal to produce an amplitude adjusted signal, an amplitude of the amplitude adjusted signal corresponding to a plateau level of the pulse; and an amplifier that controllably amplifies the amplitude adjusted signal using a plurality of stepped time varying amplification values to control a leading edge steepness and a trailing edge steepness of the pulse.

5. The apparatus of claim 4, further comprising a digital to analog converter that supplies at least one control signal to the adjustable attenuator.

6. The apparatus of claim 5, further comprising a low pass filter that filters at least one control signal.

7. The apparatus of claim 4, further comprising a digital to analog converter that supplies at least one control signal to the amplifier.

8. The apparatus of claim 7, further comprising a low pass filter that filters at least one control signal.

* * * * *